United States Patent [19]
Yoshida et al.

[11] Patent Number: 6,016,265
[45] Date of Patent: Jan. 18, 2000

[54] FUSE-LATCH CIRCUIT HAVING HIGH INTEGRATION DENSITY

[75] Inventors: Munehiro Yoshida; Ryouji Kotani, both of Yokohama, Japan

[73] Assignee: Kabushiki Kaisha Toshiba, Kawasaki, Japan

[21] Appl. No.: 09/209,120

[22] Filed: Dec. 10, 1998

[30] Foreign Application Priority Data

Dec. 12, 1997 [JP] Japan .................................. 9-343077

[51] Int. Cl.[7] .................................................. G11C 8/00
[52] U.S. Cl. ........................................ 365/96; 365/230.04
[58] Field of Search ......................... 365/94, 96, 230.04, 365/225.7

[56] References Cited

U.S. PATENT DOCUMENTS

5,237,532  8/1993  Sahara .............................. 365/189.05
5,473,570 12/1995  Sato .................................. 365/221

Primary Examiner—A. Zarabiun
Attorney, Agent, or Firm—Loeb & Loeb, LLP

[57] ABSTRACT

A semiconductor IC apparatus including a fuse-latch unit. The fuse-latch unit comprises many fuses and latch output circuits. The fuses and the latch output circuits are arranged at pitches as short as possible, leaving virtually no dead spaces between them. The fuse-latch unit is therefore short in the direction the fuses and latch output circuits are arranged, thus occupying only a small area. The latch output circuits are arranged in two parallel columns. The fuses are arranged in one column extending between the two columns of latch output circuits. The fuses are connected, alternately to the latch output circuits of the first column and those of the second column.

13 Claims, 7 Drawing Sheets

| FUSE | bFSOUT |
|---|---|
| NOT BLOWN | 1 |
| BLOWN | 0 |

FUSE-LATCH CIRCUIT HAVING HIGH INTEGRATION DENSITY

BACKGROUND OF THE INVENTION

The present invention relates to a semiconductor integrated circuit apparatus, and more particularly to a fuse-latch unit, which comprises fuse circuits and latch output circuits connected to the fuses for outputting the data the fuse circuits stores.

The integration density of LSIs keeps increasing. Integration technology is advancing in the designing of memory devices such as DRAM, SRAM and flash EEPROM and various semiconductor integrated circuits each including a memory.

Programming by using fuses is performed in semiconductor integrated circuits to select redundancy circuits, to adjust internal power supply and circuit operation minutely, and to select circuit functions. The programming is effected to reduce the difference in operating characteristics between the circuits, to enhance the yield of the product, to enable the circuits to function over broad ranges. More precisely, programming by use of fuses is carried out after a semiconductor IC chip has been manufactured. The programming is performed to compensate for the difference between the design and actual characteristic of the IC chip, to replace defective word lines and bit lines with redundancy word lines and bit lines. Thus, the programming by use of fuses determines the function and electrical characteristics of the IC chip.

Figure 1:
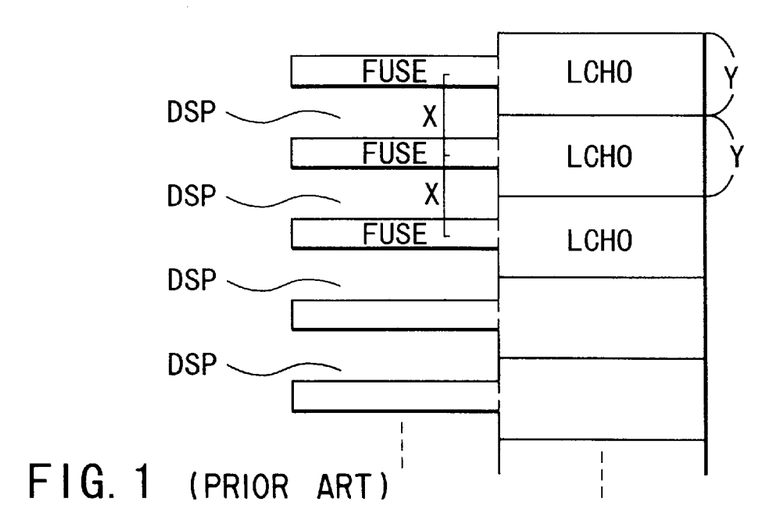
FIG. 1 is a block diagram showing the layout of a conventional fuse-latch unit.

FIG. 1 is a plan view showing the layout of a fuse-latch unit comprising fuses FUSE and latch output circuits LCHO connected to the fuses FUSE, respectively. Selected ones of the fuses FUSE are cut to accomplish programming. The fuse-latch unit is incorporated in a semiconductor IC, along with other components. The semiconductor IC is incorporated in a package, forming a semiconductor IC chip. The fuse-latch unit functions as a source of control signals that correct and adjust the operation of the semiconductor IC. The fuses FUSE, including those already cut, store read-only data from which the control signals will be generated. The latch output circuits LCHO cooperate to read the read-only data.

The higher the integration density of the semiconductor IC, the more fuses and the more latch output circuits the semiconductor IC needs to have. The greater the number of fuses and latch output circuits, the more longer the pitch of the latch output circuits than the pitch of the fuses.

Some of the fuses FUSE provided in the semiconductor IC are cut or blown by means of a laser cutter. The laser cutter has advanced in terms of performance. It can cut selected ones of fuses even if the fuses FUSE are arranged at a pitch much shorter than before. It is very difficult, however, to arrange the latch output circuits LCHO at so short a pitch as the fuses FUSE. More specifically, the pitch Y of the latch output circuits LCHO cannot be reduced further though the pitch X of the fuses FUSE can be decreased.

Hence, the minimum pitch X of the fuses FUSE is inevitably equal to the pitch Y of the latch output circuits LCHO as is illustrated in FIG. 1, though it can be reduced. As a consequence, dead spaces DSP are provided between the fuses FUSE.

The trend is that the storage capacity and size of a fuse-latch unit of the type described above is increasing. Therefore, the fuse-latch unit requires fuses and latch output circuits in greater numbers. The fuses are usually arranged in a certain region in the semiconductor IC chip in order to enhance the efficiency of blowing some of the fuses for data programming.

If the fuses and the latch output circuits are arranged at the same pitch as shown in FIG. 1, the dead spaces DSP between the fuses are left unused and, moreover, the size of the fuse-latch unit cannot be reduced in the direction the fuses are arranged. Consequently, the fuse-latch unit decreases the area in which the other components of the semiconductor IC. This makes a problem in size reduction of the semiconductor IC.

BRIEF SUMMARY OF THE INVENTION

Accordingly it is an object of the present invention to provide a semiconductor IC apparatus comprising a fuse-latch unit in which many fuses and latch output circuits are arranged at short pitches, leaving virtually no dead spaces between them, and which is therefore short in the direction the fuses and latch output circuits are arranged, thus occupying only a small area.

The object is achieved by a semiconductor integrated circuit apparatus comprising: a plurality of read-only memory devices arranged in one column; and a plurality of data-reading circuits arranged in two columns and connected to the read-only memory devices, respectively, for reading data stored by the read-only memory devices. The read-only memory devices are connected, alternately to the data-reading circuits of one of the two columns and the data-reading circuits of the other column.

Since the latch output circuits are arranged in two columns and connected to the fuses as described above, they can be arranged at a pitch, at most, twice the pitch of the fuses. Unless the pitch of the circuits exceeds twice the pitch of the fuses, it does not determine the pitch of the fuses. Therefore, almost no dead spaces exist between the fuses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 2:
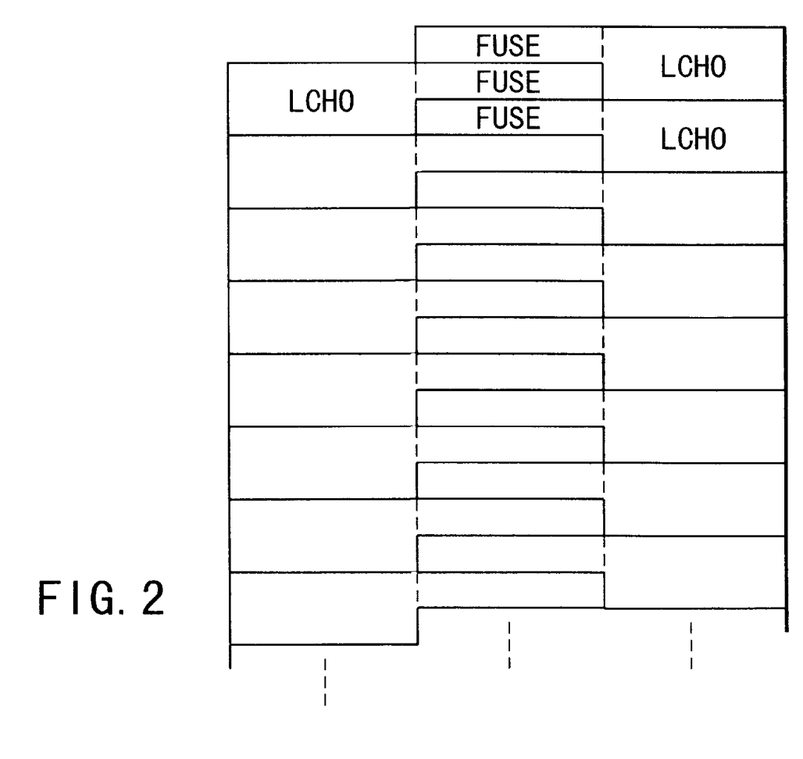
FIG. 2 i a block diagram showing the layout of the fuse-latch it incorporated in a semiconductor IC apparatus which is a first embodiment of the invention.

FIG. 2 is a block diagram showing the layout of the fuse-latch unit incorporated in a semiconductor IC apparatus according to the first embodiment of the invention. The fuse-latch unit is a source of control signals that correct and adjust the operation of the semiconductor IC provided in the IC apparatus. As shown in FIG. 2, the unit comprises fuses FUSE and latch output circuits LCHO. The fuses FUSE, some of which have been cut, store read-only data from which the control signals will be generated. The latch output circuits LCHO cooperate to output control signals generated from the read-only data.

The fuses FUSE, constituting a read-only memory, are arranged at a predetermined pitch, forming a column. The latch output circuits LCHO are provided in two columns. The first column of latch output circuits LCHO is arranged on the right of the column of fuses FUSE. The second column of latch output circuits LCHO is arranged on the left of the column of fuses FUSE. The fuses FUSE are connected, alternately to the latch output circuits LCHO of the first column and those of the second column.

Since the latch output circuits LCHO are arranged in two columns and connected to the fuses FUSE as described above, they can be arranged at a pitch, at most, twice the pitch of the fuses FUSE. Unless the pitch of the circuits LCHO exceeds twice the pitch of the fuses FUSE, it does not determine the pitch of the fuses FUSE. Therefore, almost no dead spaces exist between the fuses FUSE as illustrated in FIG. 2.

If the latch output circuits LCHO of either column are arranged at twice the pitch of the fuses FUSE, the fuse-latch unit can be half length of the length of the conventional unit (FIG. 1) having as many fuses and latch output circuits, as viewed in the direction the fuses and circuits are arranged. If the fuse-latch unit has the same length as the conventional unit shown in FIG. 1, it can have twice as many fuses and latch output circuits.

Figure 3:
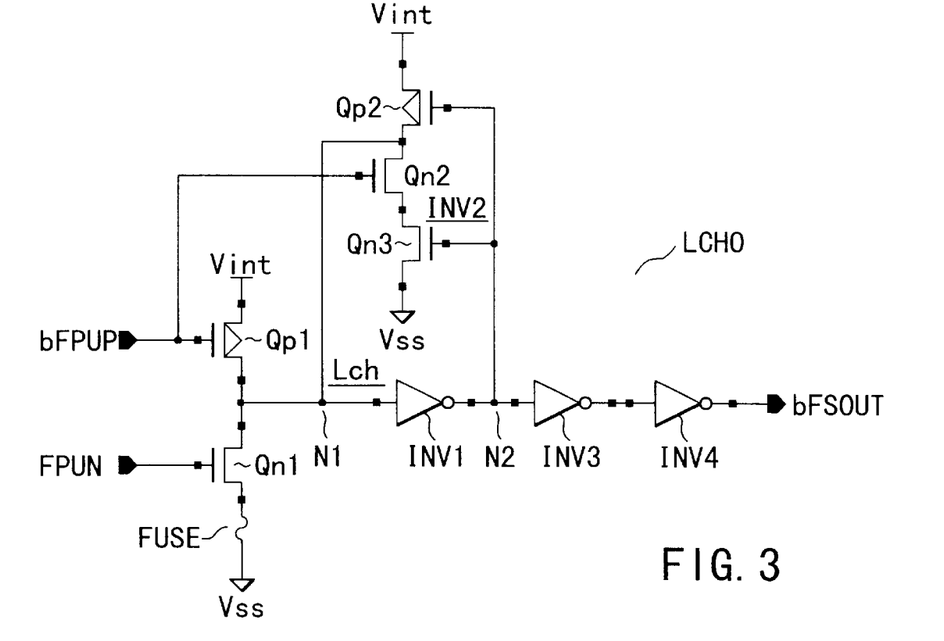
FIG. 3 is a circuit diagram of one of the fuse-latch circuit that constitute the fuse-latch unit shown in FIG. 2.

As mentioned above, the fuse-latch unit comprises fuses FUSE and latch output circuits LCHO. Each fuse FUSE is connected to one latch output circuit LOCHO, forming a fuse-latch circuit. FIG. 3 is a circuit diagram showing an example of the fuse-latch circuit.

As shown in FIG. 3, a P-channel MOS transistor Qp1, an N-channel MOS transistor Qn1, and a fuse FUSE are connected in series between a power supply (Vint) and a reference potential (e.g., the ground potential Vss). A signal bFPUP is supplied to the gate of the transistor Qp1. A signal FPUN is supplied to the gate of the transistor Qn1. The drain node of the transistors Qp1 and Qn1 is connected to the first node N1 of a latch circuit Lch.

The latch circuit Lch comprises two inverters INV1 and INV2. The inputs (nodes N1) of the inverters INV1 and INV2 are connected, and the outputs (nodes N2) thereof are connected. The inverter INV2 is a series circuit composed of one P-channel MOS transistor Qp2 and two N-channel MOS transistors Qn2 and Qn3. The transistor Qn2 is the latch-resetting element, and its gate is connected to the gate of the transistor Qp1. The node N2 of the latch circuit Lch is connected to the input terminal of an inverter INV3. The output terminal of the inverter INV3 is connected to the input terminal of an inverter INV4. The output of the inverter INV4 is the output signal bFSOUT of the latch circuit Lch.

Figure 4:
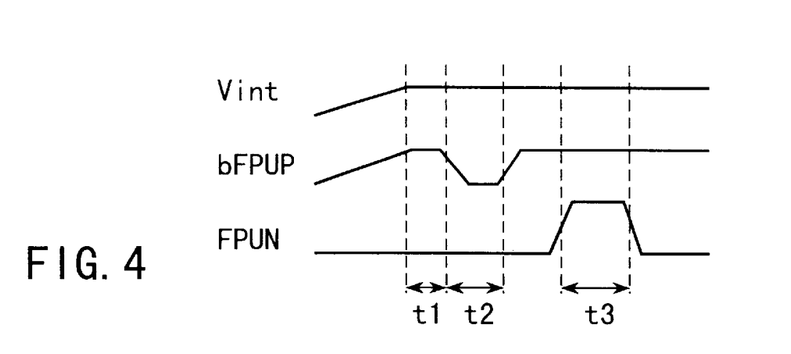
FIG. 4 is a timing chart illustrating the waveforms of signals and explaining the operation of the fuse-latch circuit shown in FIG. 3.
Figure 5:
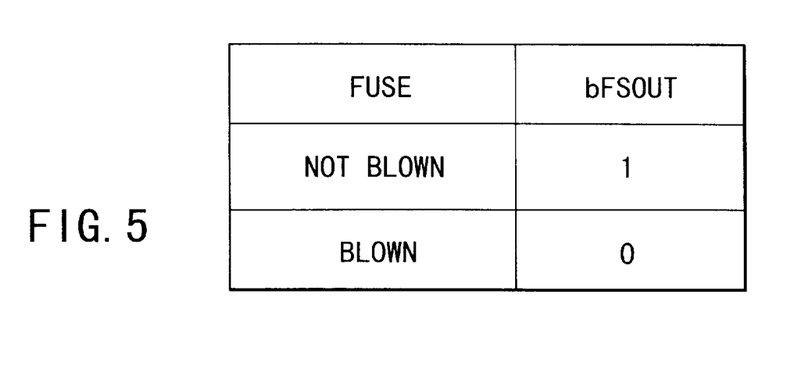
FIG. 5 is a table representing the outputs of the fuse-latch circuit shown in FIG. 3 can generate.

FIG. 4 shows the waveforms of signals and explaining the operation of the fuse-latch circuit (FIG. 3), and FIG. 5 represents the outputs the fuse-latch circuit (FIG. 3) can generates. As seen from FIG. 4, the transistor Qp1 is turned on within about time t2 after about time t1 has lapsed from the power-on of the fuse-latch circuit. The output of the inverter INV1 turns on the transistor Qp2, whereby charging is completed. Next, the transistor Qp1 is turned off and Qn1 is turned on within about time t3. The output signal bFSOUT of the latch circuit Lch has a logic level or another, depending upon whether the fuse FUSE is blown (cut) or not. More precisely, as shown in FIG. 5, the signal bFSOUT has logic level of 1 when the fuse FUSE is not blown, and has logic level of 0 when the fuse FUSE is blown.

Figure 6:
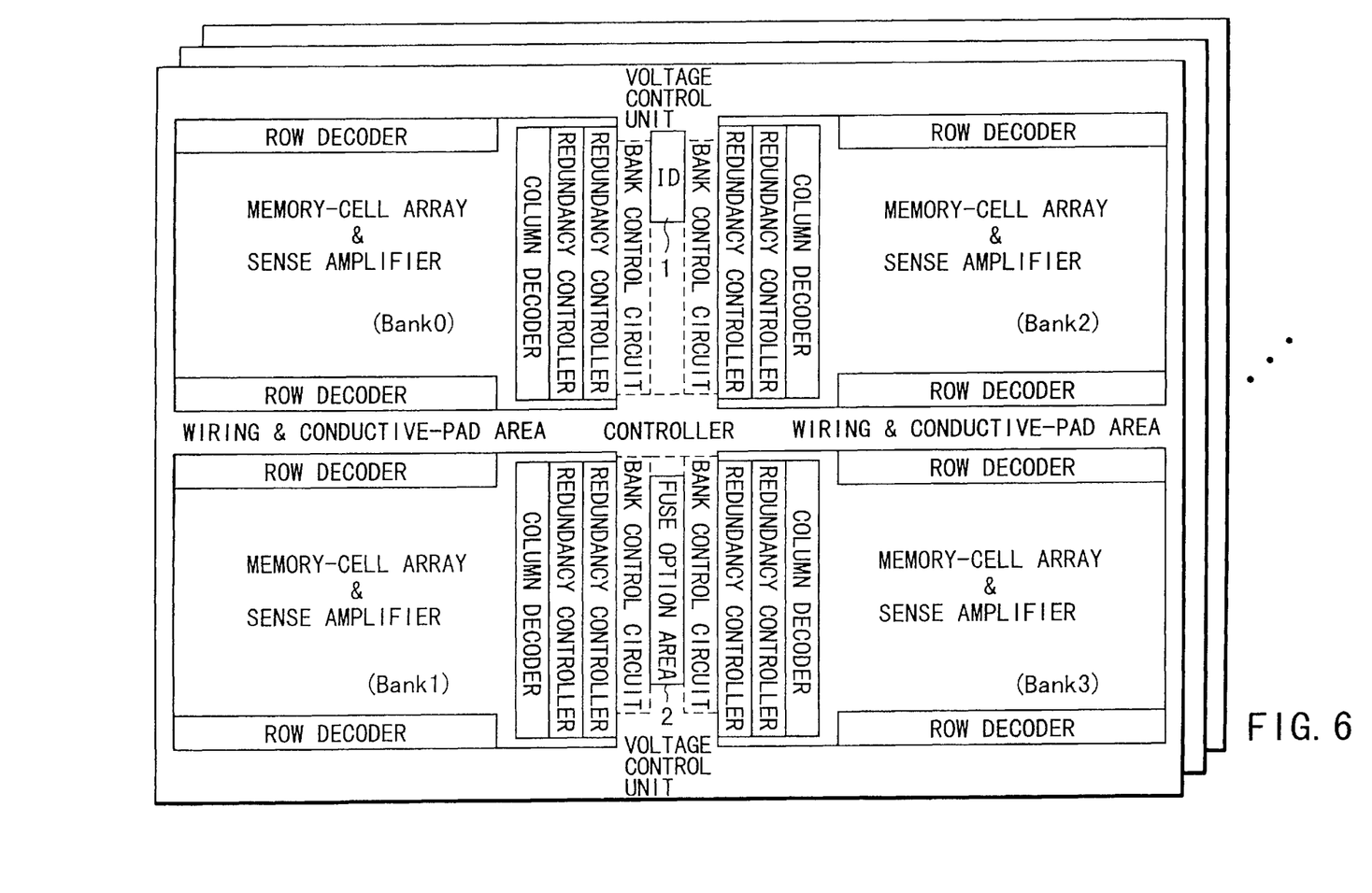
FIG. 6 a block diagram of a DRAM, or a semiconductor IC apparatus that is a second embodiment of the present invention.

FIG. 6 is a block diagram of a DRAM, i.e., a semiconductor IC apparatus that is a second embodiment of the invention. As FIG. 6 shows, the DRAM comprises a plurality of DRAM chips. Each DRAM chip is composed of four banks 0 to 3. Each bank includes a row decoder, a column decoder, a memory-cell, array, a sense amplifier, redundancy controllers, and various data lines (not shown). The redundancy controllers are provided to replace defective memory cells, if any, with redundancy memory cells. The banks 0 and 1 are identical in structure. The banks 0 and 2 are mirror images to each other in terms of layout pattern. The banks 1 and 3 are mirror images to each other in terms of layout pattern.

The DRAM may comprise only one DRAM chip, not two or more DRAM chips as shown in FIG. 6.

Each DRAM has a CHIP-ID 1 storing the data identifying the DRAM CHIP, including the lot number, manufacture date, the wafer position, and the like. The CHIP-ID 1 is a fuse-latch unit of the type shown in FIG. 2. More specifically, the CHIP-ID 1 has the layout pattern shown in FIG. 2 and comprises about 128 fuses and about 128 latch output circuits.

Each DRAM also has a fuse option area 2 storing the data for minutely adjusting the internal power supply, minutely altering the operating margins of the internal circuits and selecting the functions of the internal circuits. In other words, the data stored in the fuse option area 2 determines the functions and electrical characteristics of the DRAM chip. The fuse option area 2 is a fuse-latch unit of the type illustrated in FIG. 2. More specifically, the CHIP-ID 1 has the layout pattern shown in FIG. 2 and comprises about 64 fuses and about 64 latch output circuits. The fuse option area 2 generates control signals, which designate the refresh cycle of the DRAM.

Both the CHIP-ID 1 and the fuse option area 2 have the same layout pattern as the fuse-latch unit shown in FIG. 2. Namely, the chips 1 and 2 each comprise a column of fuses FUSE and two columns of latch output circuits LCHO, and the columns of latch output circuits are arranged symmetrical with respect to the column of fuses. Further, the CHIP-ID 1 and the fuse option area 2 are located in the centerline of the DRAM chip as is illustrated in FIG. 6. Therefore, the output lines extending from the latch output circuits LCHO of the first column can be symmetrical to the output lines extending from the latch output circuits LCHO of the second column. This makes it much easier to lay out the output lines of the circuits LCHO than in the case where the CHIP-ID 1 and the fuse option area 2 have the conventional layout pattern shown in FIG. 1.

Figure 7:
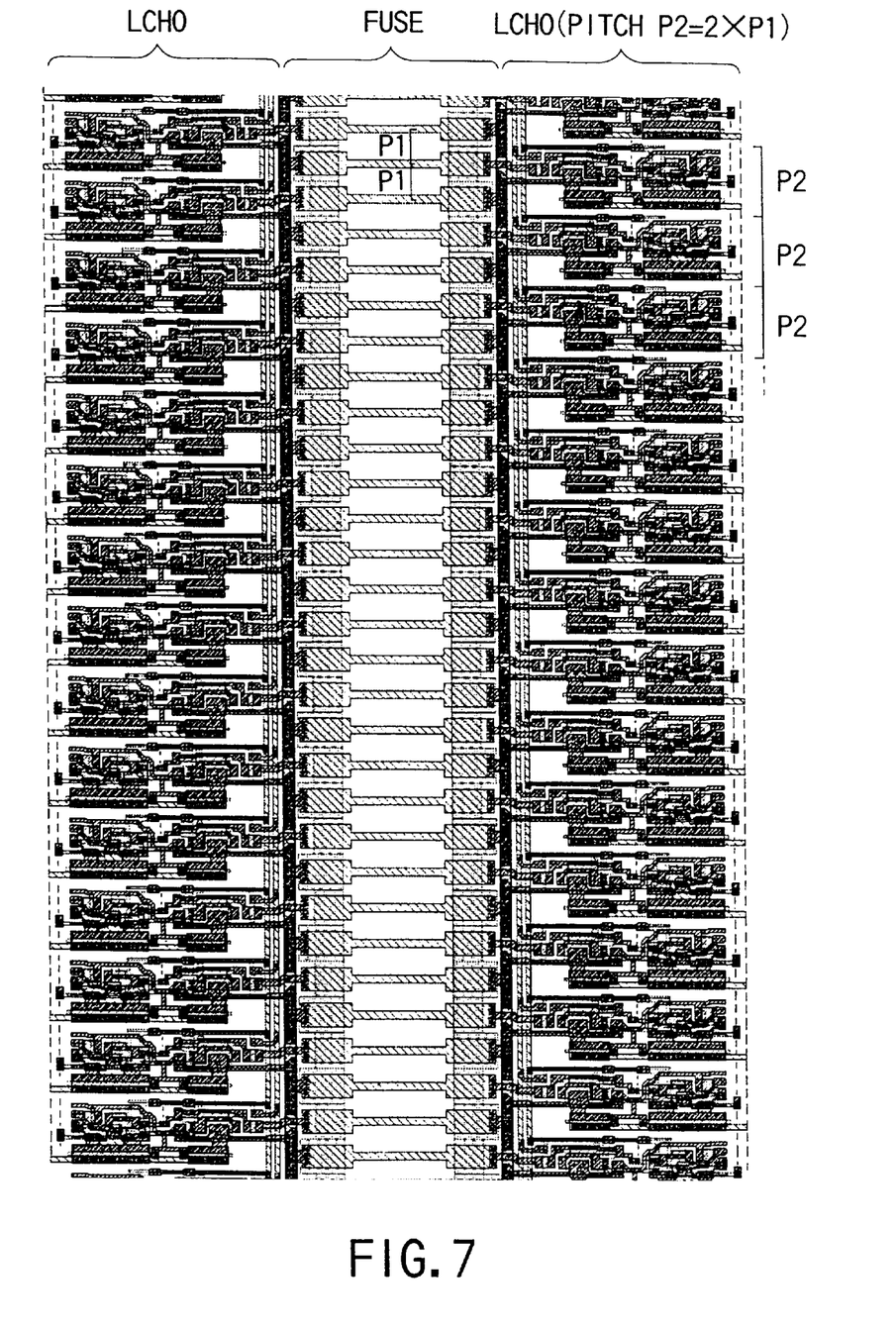
FIG. 7 is a plan view depicting the layout of the fuse-latch unit provided in a region of the DRAM shown in FIG. 6.

FIG. 7 is a plan view depicting the layout of the fuse FUSE and latch output circuits LCHO which constitute either the CHIP-ID 1 or the fuse option area 2 shown in FIG. 6. As shown in FIG. 7, the fuses FUSE are arranged at a pitch P1, forming one column, whereas the latch output circuits LCHO are arranged at a pitch P2, forming two columns. It should be noted that the pitch P1 is half the pitch P2. Hence, virtually no dead spaces exist between the fuses FUSE. Namely, two fuses FUSE are arranged over a distance which is nearly equal to the width of one latch output circuit LCHO, and the fuses FUSE are connected, alternately to the latch output circuits of the first column and those of the second column.

Figure 8:
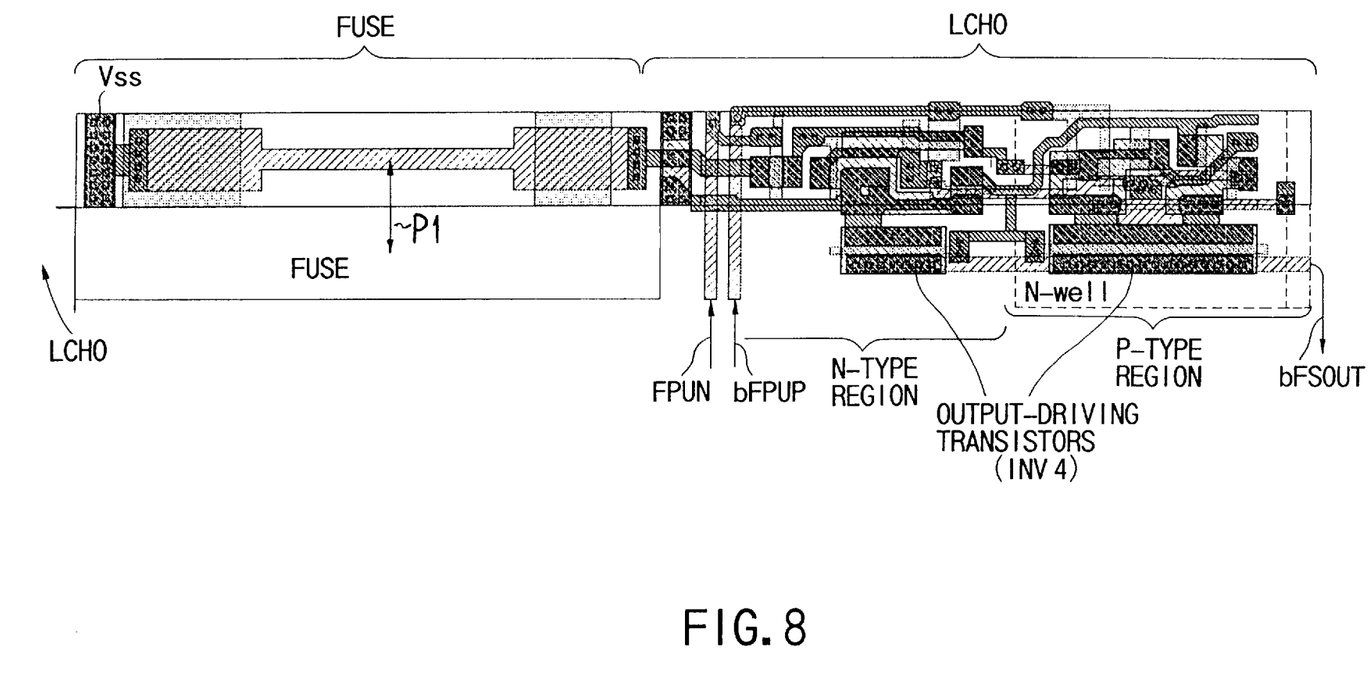
FIG. 8 is a plan view showing the layout of one of the fuse-latch circuits that constitute the fuse-latch unit illustrated in FIG. 7.

FIG. 8 is a plan view showing the layout of one of the fuse-latch circuits which are identical and which constitute the fuse-latch unit of FIG. 7. As shown in FIG. 8, the pitch P1 at which the fuses FUSE are arranged is about 4.5 μm. With the existing manufacture technology it requires high cost to arrange a transistor (either in a horizontal or vertical position) and provide a wiring region over a distance equal to the pitch P1 of about 4.5 μm. In the present invention, the output-driving transistors, which are relatively large elements, are arranged next to the region where the other elements of the latch output circuit LCHO are provided. To be more specific, the P- and N-channel MOS transistors constituting the inverter INV4 are arranged next to said region, as viewed in the direction in which the circuits LCHO are arranged, forming a column. Since the P- and N-channel MOS transistors constituting the inverter INV4 are so arranged, each latch output circuit LCHO can be provided within a rectangular region the width of which is about 9 μm, which is twice the pitch P1 of the fuses FUSE.

If the fuse-latch circuit shown in FIG. 8 need not have output-driving transistors (i.e., large elements), it can become smaller. A plurality of such smaller fuse-latch circuits may be arranged in, for example, any one of the redundancy controllers shown in FIG. 6. If so, the elements to which the output signals of the fuse-latch circuits will be closer to the fuse-latch circuits than in the case where the fuse-latch unit is used as the CHIP-ID 1 or the fuse option area 2. Each of the redundancy controllers shown in FIG. 6 may therefore comprise a plurality of fuse-latch circuits which are identical to those shown in FIG. 8 except that each has no output-driving transistors.

Figure 9:
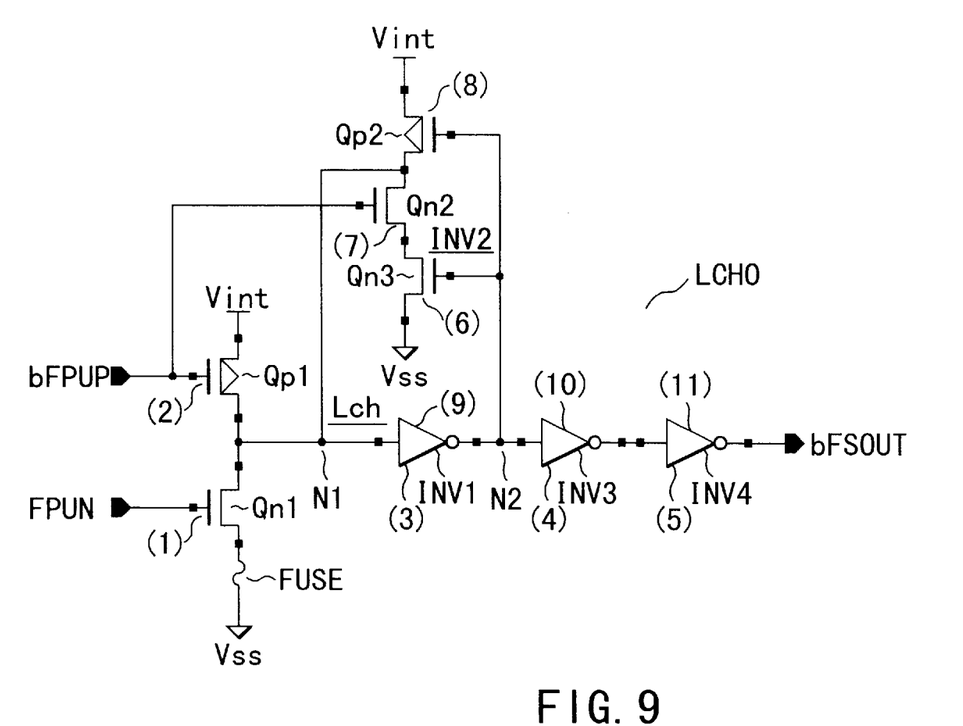
FIG. 9 is a circuit diagram of one of the fuse-latch circuits that same constitute a fuse-latch unit of FIG. 3, according to the present invention.
Figure 10:
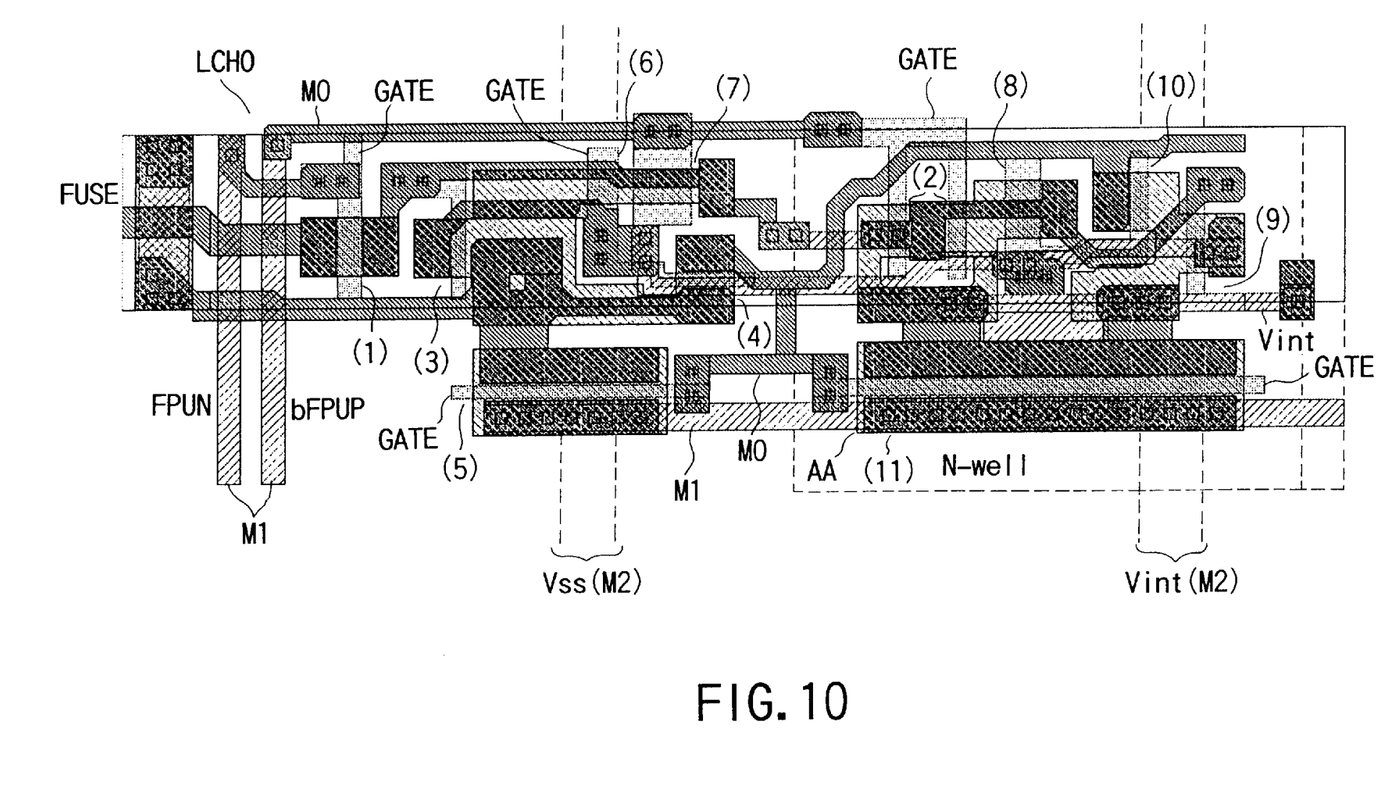
FIG. 10 is an enlarged plan view showing the layout of the fuse-latch circuit illustrated in FIG. 9.

FIG. 9 is a circuit diagram of one of the fuse-latch circuits that same constitute a fuse-latch unit of FIG. 3, according to the present invention. FIG. 10 is an enlarged plan view showing the layout of the fuse-latch circuit illustrated in FIG. 9. The inverters INV1 to INV4 provided in the fuse-latch circuit are CMOS inverters. In FIG. 9, the N-channel MOS transistors included in the inverters INV1, INV3 and INV4 are designated at (3), (4) and (5), while the P-channel MOS transistors included in the inverters INV1, INV3 and INV4 are denoted at (9), (10) and (11). In FIG. 10, the numerals (3), (4), (5), (9), (10) and (11) represent the positions these MOS transistors assume in the fuse-latch circuit.

In FIG. 10, M1 denote lines made by processing a first metal layer. The fuse FUSE (not shown in FIG. 10) has been made also by processing the first metal layer. M0 represents lines made by processing a second metal layer formed below the first metal layer. The power supply lines M2 indicated by broken lines have been made by processing a third metal layer formed above the first metal layer. Shown in FIG. 10 is an activated region AA, which is located below an element-forming region.

In the fuse-latch unit constituted by fuse-latch circuits of the type shown in FIGS. 9 and 10, the fuses FUSE are arranged, leaving virtually no dead spaces between them. The fuses FUSE are arranged, side by side, forming a column that extends between the two columns of latch output circuits LCHO. Hence, if the fuse-latch unit of FIGS. 9 and 10 is used as the CHIP-ID 1 or fuse option area 2 shown in FIG. 6, the fuses FUSE can be easily positioned and some of them can be blown efficiently.

Since virtually no dead spaces exist between the fuses FUSE, the fuse-latch unit of FIGS. 9 and 10 can be shorter than otherwise in the direction in which the fuses FUSE are arranged. Therefore, the fuse-latch unit greatly serves to increase an area in which other circuits may be provided. If the unit is used as the CHIP-ID 1 or fuse option area, it can help provide a particularly large area at an end of the column of fuses FUSE. Capacitors (i.e., large elements) may be provided in this large area, in order to compensate for changes in the power-supply voltage. The fuse-latch unit, thus made relatively short, serves to enhance the reliability of the semiconductor IC in which it is incorporated.

The present invention provides a fuse-latch unit in which the pitch of the fuses need not be determined by or equal to the pitch of the latch output circuits connected to the fuses, even if the fuses are far narrower than the latch output circuits. The fuse-latch unit may be used as the redundancy controllers provided in the DRAM illustrated in FIG. 6. Furthermore, it may be used in any semiconductor IC apparatus other than the DRAM of FIG. 6, in which fuses and latch output circuits must be used to accomplish data-programming.

As has been described above, the invention can provide a semiconductor IC apparatus comprising a fuse-latch unit in which many fuses and latch output circuits are arranged at short pitches, leaving virtually no dead spaces between them. The apparatus is therefore short in the direction the fuses and latch output circuits are arranged, thus occupying only a small area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor integrated circuit apparatus comprising:
    a plurality of read-only memory devices arranged in one column; and
    a plurality of data-reading circuits arranged in two columns and connected to the read-only memory devices, respectively, for reading data stored by the read-only memory devices,
    wherein said read-only memory devices are connected, alternately to the data-reading circuits of one of said two columns and the data-reading circuits of the other column.

2. The apparatus according to claim 1, wherein the read-only memory devices are arranged at half a pitch at which the data-reading circuits of each column are arranged.

3. The apparatus according to claim 1, wherein the read-only memory devices are fuses.

4. The apparatus according to claim 1, wherein the read-only memory devices are fuses and each of the data-reading circuits is twice as broad as each read-only memory device.

5. The apparatus according to claim 1, wherein the read-only memory devices are fuses, each of the data-reading circuits includes a latch circuit for latching data from the read-only memory device connected to the data-reading circuit and an output-driving transistor for outputting a signal corresponding to the data latched by the latch circuit, and the output-driving transistors of the data-reading circuits are arranged side by side in the same direction as the fuses are arranged.

6. A semiconductor integrated circuit apparatus comprising:
   a plurality of chips each having a storage device composed of banks;
   a plurality of read-only memory devices provided in each of the chips and arranged in one column in a region between the banks; and
   a plurality of data-reading circuits arranged in two columns and connected to the read-only memory devices, respectively, for reading data stored by the read-only memory devices,
   wherein said read-only memory devices are connected, alternately to the data-reading circuits of one of said two columns and the data-reading circuits of the other column.

7. The apparatus according to claim 6, wherein the read-only memory devices are arranged at half a pitch at which the data-reading circuits of each column are arranged.

8. The apparatus according to claim 6, wherein the read-only memory devices are fuses.

9. The apparatus according to claim 6, wherein the read-only memory devices are fuses and each of the data-reading circuits is twice as broad as each read-only memory device.

10. The apparatus according to claim 6, wherein the read-only memory devices are fuses, each of the data-reading circuits includes a latch circuit for latching data from the read-only memory device connected to the data-reading circuit and an output-driving transistor for outputting a signal corresponding to the data latched by the latch circuit, and the output-driving transistors of the data-reading circuits are arranged side by side in the same direction as the fuses are arranged.

11. A semiconductor integrated circuit apparatus comprising:
    a chip having a storage device composed of banks;
    a plurality of read-only fuses provided in each of the chip and arranged in one column in a region between the banks; and
    a plurality of data-reading circuits arranged in two columns and connected to the read-only fuses, respectively, for reading data stored by the read-only fuses,
    wherein said read-only fuses are connected, alternately to the data-reading circuits of one of said two columns and the data-reading circuits of the other column.

12. The apparatus according to claim 11, wherein the fuses store data identifying the chip.

13. The apparatus according to claim 11, wherein the fuses store data, which determines function and electrical characteristics of the chip.

* * * * *